United States Patent
Ahn et al.

(10) Patent No.: US 8,952,422 B2
(45) Date of Patent: Feb. 10, 2015

(54) TRANSISTOR AND METHOD OF FABRICATING THE SAME

(71) Applicant: Electronics and Telecommunications Research Institute, Daejeon (KR)

(72) Inventors: Hokyun Ahn, Daejeon (KR); Jong-Won Lim, Daejeon (KR); Jeong-Jin Kim, Jeollabuk-do (KR); Hae Cheon Kim, Daejeon (KR); Jae Kyoung Mun, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/912,350

(22) Filed: Jun. 7, 2013

(65) Prior Publication Data
US 2014/0167111 A1    Jun. 19, 2014

(30) Foreign Application Priority Data

Dec. 18, 2012   (KR) ................ 10-2012-0148675

(51) Int. Cl.
*H01L 29/66* (2006.01)
*H01L 29/423* (2006.01)
*H01L 29/778* (2006.01)
*H01L 29/20* (2006.01)

(52) U.S. Cl.
CPC .... *H01L 29/42316* (2013.01); *H01L 29/42376* (2013.01); *H01L 29/66462* (2013.01); *H01L 29/7786* (2013.01); *H01L 29/4236* (2013.01); *H01L 29/2003* (2013.01)
USPC ............ 257/194; 257/E29.246; 257/E21.403; 438/172

(58) Field of Classification Search
CPC ................... H01L 21/30621; H01L 21/7605
USPC ............................. 257/194, E29.246
See application file for complete search history.

(56) References Cited

U.S. PATENT DOCUMENTS

| 4,733,283 | A  | * | 3/1988 | Kuroda ................... 257/195 |
| 7,573,078 | B2 |   | 8/2009 | Wu et al. |
| 2004/0063303 | A1 | * | 4/2004 | Behammer ............... 438/585 |

FOREIGN PATENT DOCUMENTS

| KR | 10-0276077 B1 | 1/2001 |
| KR | 10-0782430 B1 | 12/2007 |
| KR | 10-2008-0036002 A | 4/2008 |

OTHER PUBLICATIONS

Eldad Bahat-Treidel et al., AlGaN/GaN/AlGaN DH-HEMTs Breakdown Voltage Enhancement Using Multiple Grating Field Plates (MGFPs), IEEE Transactions on Electron Devices, Jun. 2010, pp. 1208-1216, vol. 57, No. 6.

(Continued)

*Primary Examiner* — Thao X Le
*Assistant Examiner* — Patricia Reddington
(74) *Attorney, Agent, or Firm* — Rabin & Berdo, P.C.

(57) ABSTRACT

A field effect transistor includes an active layer and a capping layer sequentially stacked on a substrate, and a gate electrode penetrating the capping layer and being adjacent to the active layer. The gate electrode includes a foot portion adjacent to the active layer and a head portion having a width greater than a width of the foot portion. The foot portion of an end part of the gate electrode has a width less than a width of the head portion of another part of the gate electrode and greater than a width of the foot portion of the another part of the gate electrode. The foot portion of the end part of the gate electrode further penetrates the active layer so as to be adjacent to the substrate.

5 Claims, 25 Drawing Sheets

(56) References Cited

OTHER PUBLICATIONS

Eizo Mitani et al., "Mass-Production of High-Voltage GaAs and GaN Devices", CS MANTECH Conference, Apr. 24-27, 2006, pp. 183-186.

A. Chini et al., "Power and Linearity Characteristics of Field-Plated Recessed-Gate AlGaN—GaN HEMTs", IEEE Electron Device Letters, May 2004, pp. 229-231, vol. 25 No. 5.

\* cited by examiner

TRANSISTOR AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0148675, filed on Dec. 18, 2012, the entirety of which is incorporated by reference herein.

BACKGROUND

The inventive concept relates to transistors and methods of fabricating the same and, more particularly, to field effect transistors and methods of fabricating the same.

A high electron mobility transistor (HEMT) is a kind of compound semiconductor device. Generally, one or more layers included in the HEMT have lattice constants very different from those of other layers, such that a structure of a material used as a channel layer may be modified. A mobility of electrons in the channel layer of the HEMT may be improved by the stress modification according to the lattice mismatch, such that an operating speed of the HEMT may be improved.

It is difficult to grow a substrate for the HEMT. However, the HEMT has higher power and improved noise characteristics by an increase of the density of charges transmitted to the channel layer and by the high electron mobility. Thus, the HEMT may be operated at a high frequency. The HEMTs have excellent electron speed characteristics as compared with an electronic device using silicon, so that they are widely used in device applications of microwave and millimetric wave bands.

Gallium nitride (GaN) corresponding to a nitride semiconductor is a direct transition type semiconductor. The gallium nitride is attractive as a new material of high frequency electronic devices because of its a high electric field electron mobility (e.g., $2 \times 10^{-7}$ cm/s) and a high breakdown electric field (e.g., $3 \times 10^6$ V/cm). The nitride semiconductor may be realized as a heterojunction structure such as aluminum-gallium nitride/gallium nitride (AlGaN/GaN). Additionally, the nitride semiconductor may be selective doped. Thus, the nitride semiconductor maybe designed to have an optimized structure for a high speed. Due to the above physical properties of the nitride semiconductor, an electronic device including the nitride semiconductor may improve trade off relationship between a cutoff frequency (ft) and a breakdown voltage ($V_{BV}$) which is a problem in a conventional field effect transistor (FET). Thus, the electronic device including the nitride semiconductor may have high voltage and high frequency characteristics.

If a FET includes the nitride semiconductor which has a great power density as well as the high voltage operation characteristic and is used in an amplifier module, a peripheral circuit such as a power distribution synthesis circuit and a direct current (DC) voltage converting circuit may be omitted or simplified in the amplifier module. Thus, it is possible to realize a high power amplifier module having high power usage efficiency.

Additionally, a high speed semiconductor device may use a T-shape, Y-type or mushroom-type gate having a wide cross-sectional area in order that a resistance of the gate is reduced to improve its noise characteristic. The T-type, Y-type, or mushroom-type gate is generally formed by an electron beam (E-beam) lithography method or a photolithography method.

SUMMARY

Embodiments of the inventive concept may provide field effect transistors capable of increasing a breakdown voltage, of improving a cutoff frequency, and of stably and reliably being operated in a high voltage operation.

Embodiments of the inventive concept may also provide methods of fabricating a high electron mobility transistor capable of increasing a breakdown voltage, of improving a cutoff frequency, and of stably and reliably being operated in a high voltage operation.

In one aspect, a field effect transistor may include: an active layer and a capping layer sequentially stacked on a substrate; a source ohmic electrode and a drain ohmic electrode spaced apart from each other on the capping layer; and a gate electrode disposed on the substrate between the source and drain ohmic electrodes, the gate electrode penetrating the capping layer and adjacent to the active layer. The gate electrode may include a foot portion adjacent to the active layer and a head portion disposed on the foot portion and having a width greater than a width of the foot portion. The gate electrode may include both end parts in an extending direction of the gate electrode. The foot portion of each of the both end parts of the gate electrode may have a width less than a width of the head portion of another part of the gate electrode and greater than a width of the foot portion of the another part of the gate electrode. The foot portion of each of the both end parts of the gate electrode may further penetrate the active layer so as to be adjacent to the substrate.

In an embodiment, the foot portion of a center part of the gate electrode in the extending direction of the gate electrode may have a width less than the width of the head portion of the another part of the gate electrode and greater than the width of the foot portion of the another part of the gate electrode; and the foot portion of the center part of the gate electrode may further penetrate the active layer so as to be adjacent to the substrate.

In an embodiment, the head portion of the gate electrode may laterally extend toward the drain ohmic electrode.

In an embodiment, the field effect transistor may further include: an insulating layer disposed between the gate electrode and the active layer and/or between the gate electrode and the capping layer. The insulating layer may include silicon nitride, silicon oxide, porous silicon oxide, or benzocyclobutene.

In an embodiment, the substrate may be an insulating substrate. The insulating substrate may include gallium nitride, silicon, silicon carbide, semi-insulating gallium arsenide, or sapphire.

In an embodiment, the active layer may include a first layer including gallium nitride and a second layer including aluminum gallium nitride (AlGaN).

In an embodiment, the capping layer may include gallium nitride.

In another aspect, a method of fabricating a field effect transistor may include: sequentially forming an active layer and capping layer on a substrate; forming a source ohmic electrode and a drain ohmic electrode spaced apart from each other on the capping layer; forming an insulating layer covering the source and drain ohmic electrodes on the capping layer; forming a first photoresist layer having a first opening exposing a portion of the insulating layer between the source and drain ohmic electrodes; removing the portion of the insulating layer under the first opening by an etching process using the first photoresist layer as an etch mask to expose the capping layer under the first opening and to define a second opening in the insulating layer; removing the first photoresist layer; removing a portion of the capping layer under the second opening by an etching process using the insulating layer as an etch mask to expose the active layer under the second opening and to define a third opening in the insulating and capping layers; forming a second photoresist layer having a fourth opening on the insulating layer having the third opening, the fourth opening having a width greater than a width of the third opening; forming a gate electrode filling the third opening and the fourth opening, the gate electrode contacting the active layer through the third opening; and removing the second photoresist layer. The gate electrode may include a foot portion connected to the active layer and a head portion disposed on the foot portion and having a width greater than a width of the foot portion. The gate electrode may include both end parts in an extending direction of the gate electrode. The foot portion of each of the both end parts of the gate electrode may have a width less than a width of the head portion of another part of the gate electrode and greater than a width of the foot portion of the another part of the gate electrode. The foot portion of each of the both end parts of the gate electrode may further penetrate the active layer so as to be connected to the substrate.

In an embodiment, the foot portion of a center part of the gate electrode in the extending direction of the gate electrode may have a width less than the width of the head portion of the another part of the gate electrode and greater than the width of the foot portion of the another part of the gate electrode; and the foot portion of the center part of the gate electrode may further penetrate the active layer so as to be connected to the substrate.

In an embodiment, the head portion of the gate electrode may laterally extend toward the drain ohmic electrode.

In an embodiment, the active layer may include a first layer including gallium nitride and a second layer including aluminum gallium nitride (AlGaN).

In an embodiment, the capping layer may be formed of gallium nitride.

In an embodiment, the insulating layer may include silicon nitride, silicon oxide, porous silicon oxide, or benzocyclobutene.

In still another aspect, a method of fabricating a field effect transistor may include: sequentially forming an active layer and capping layer on a substrate; forming a first photoresist layer having a first opening exposing a portion of the capping layer; removing the portion of the capping layer under the first opening by an etching process using the first photoresist layer as an etch mask to expose the active layer under the first opening and to define a second opening in the capping layer; removing the first photoresist layer; forming an insulating layer on an entire surface of the substrate to define a third opening surrounded the insulating layer in the second opening; forming a second photoresist layer having fourth openings exposing portions of the insulating layer at both sides of the third opening, respectively, the exposed portions of the insulating layer spaced part from the third opening; removing the exposed portions of the insulating layer under the fourth openings by an etching process using the second photoresist layer as an etch mask to expose the capping layer under the fourth openings; forming a source ohmic electrode and a drain ohmic electrode on exposed portions of capping layer in the fourth openings, respectively; removing the second photoresist layer; forming a third photoresist layer having a fifth opening on the insulating layer having the third opening, the fifth opening having a width greater than a width of the third opening; forming a gate electrode filling the third opening and the fifth opening; and removing the third photoresist layer. The gate electrode may include a foot portion adjacent to the active layer and a head portion disposed on the foot portion and having a width greater than a width of the foot portion. The gate electrode may include both end parts in an extending direction of the gate electrode. The foot portion of each of the both end parts of the gate electrode may have a width less than a width of the head portion of another part of the gate electrode and greater than a width of the foot portion of the another part of the gate electrode; and the foot portion of each of the both end parts of the gate electrode may further penetrate the active layer so as to be adjacent to the substrate.

In an embodiment, the foot portion of a center part of the gate electrode in the extending direction of the gate electrode may have a width less than the width of the head portion of the another part of the gate electrode and greater than the width of the foot portion of the another part of the gate electrode; and the foot portion of the center part of the gate electrode may further penetrate the active layer so as to be adjacent to the substrate.

In an embodiment, the active layer may include a first layer including gallium nitride and a second layer including aluminum gallium nitride (AlGaN).

In an embodiment, the capping layer may be formed of gallium nitride.

In an embodiment, the insulating layer may include silicon nitride, silicon oxide, porous silicon oxide, or benzocyclobutene.

BRIEF DESCRIPTION OF THE DRAWINGS

The inventive concept will become more apparent in view of the attached drawings and accompanying detailed description.

FIGS. 2A to 9A are cross-sectional views taken along a line I-I' of FIG. 1 to illustrate a method of fabricating a field effect transistor according to some embodiments of the inventive concept;

FIGS. 2B to 9B are cross-sectional views taken along a line II-II' of FIG. 1 to illustrate a method of fabricating a field effect transistor according to some embodiments of the inventive concept;

FIGS. 14A to 22A are cross-sectional views taken along a line III-III' of FIG. 13 to illustrate a method of fabricating a field effect transistor according to still other embodiments of the inventive concept;

FIGS. 14B to 22B are cross-sectional views taken along a line IV-IV' of FIG. 13 to illustrate a method of fabricating a field effect transistor according to still other embodiments of the inventive concept.

DETAILED DESCRIPTION OF THE EMBODIMENTS

Figure 1:
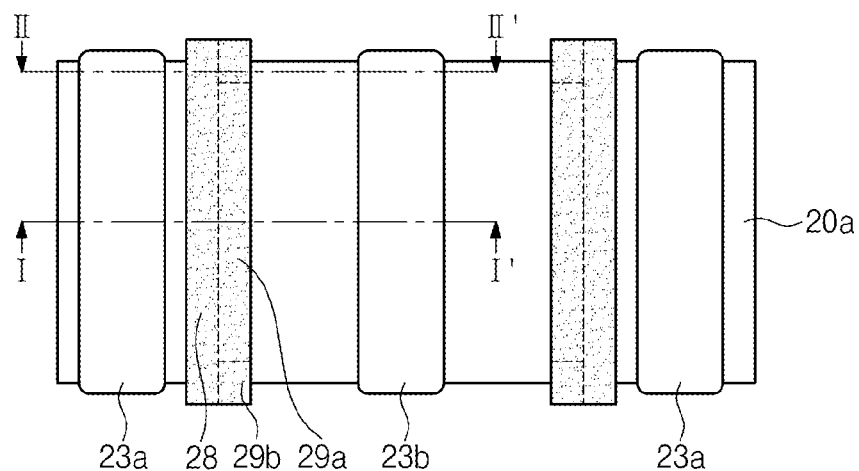
FIG. 1 is a plan view illustrating a field effect transistor according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a plan view illustrating a field effect transistor according to some embodiments of the inventive concept. FIGS. 2A to 9A are cross-sectional views taken along a line I-I' of FIG. 1 to illustrate a method of fabricating a field effect transistor according to some embodiments of the inventive concept. FIGS. 2B to 9B are cross-sectional views taken along a line II-II' of FIG. 1 to illustrate a method of fabricating a field effect transistor according to some embodiments of the inventive concept.

Figure 9A:
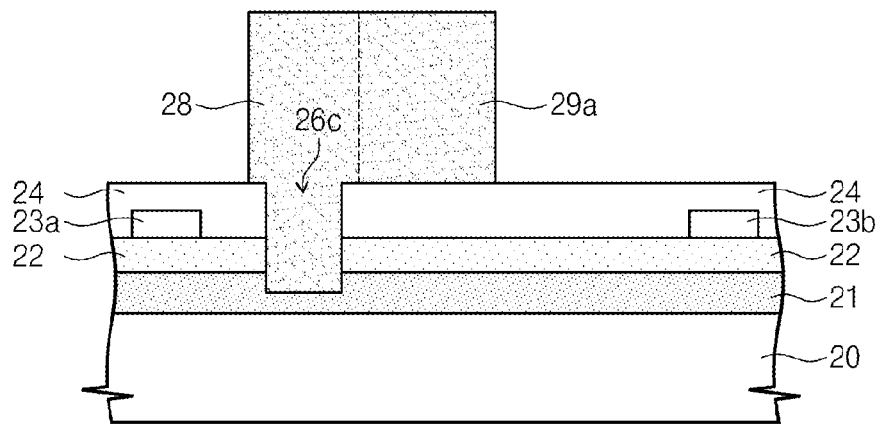
Figure 9B:
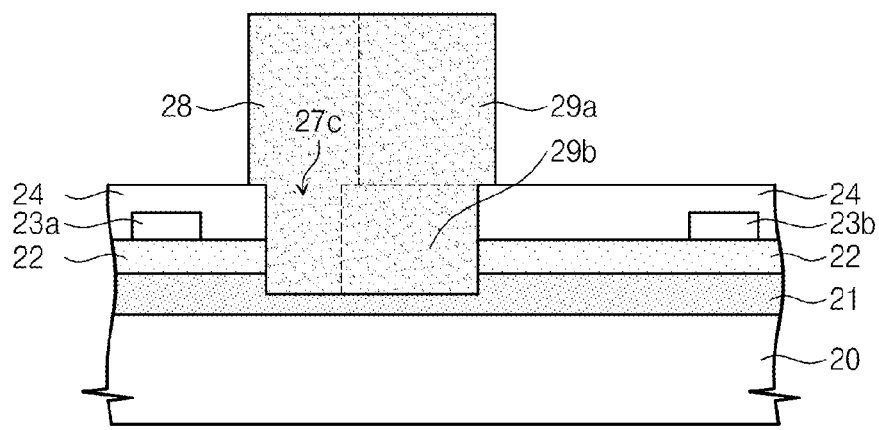

Referring to FIGS. 1, 9A, and 9B, a field effect transistor includes a substrate 20, an active layer 21, a capping layer 22, a source ohmic electrode 23a, a drain ohmic electrode 23b, an insulating layer 24, and a gate electrode.

The substrate 20 may be an insulating substrate. The insulating substrate may include gallium nitride (GaN), silicon (Si), silicon carbide (SiC), semi-insulating gallium arsenide (GaAs), or sapphire. The insulating substrate may be doped with dopant ions.

The active layer 21 and the capping layer 22 may be sequentially stacked on the substrate 20. The active layer 21 may be a double layer consisting of a first layer and a second layer. The first layer and the second layer of the active layer 21 may include gallium nitride (GaN) and aluminum gallium nitride (AlGaN), respectively. The capping layer 22 may include gallium nitride.

The source ohmic electrode 23a and the drain ohmic electrode 23b may be disposed to be spaced apart from each other on the capping layer 22. The source ohmic electrode 23a and the drain ohmic electrode 23b may include conductive material. For example, the source and drain ohmic electrodes 23a and 23b may include an alloy formed by performing a rapid thermal treatment on a stack structure including titanium/aluminum/nickel/gold (Ti/Al/Ni/Au), a stack structure including titanium/aluminum/nickel/palladium/gold (Ti/Al/Ni/Pd/Au), or a stack structure of gold-germanium/nickel/gold (AuGe/Ni/Au).

The insulating layer 24 may be disposed on the capping layer 24 to cover the source and drain ohmic electrodes 23a and 23b. The insulating layer 24 may include silicon nitride (SiN), silicon oxide ($SiO_2$), porous silicon oxide, or benzocyclobutene (BCB).

The gate electrode may include a foot portion and a head portion connected to each other. The foot portion of the gate electrode may penetrate the insulating layer 24 and the capping layer 22 so as to be connected to the active layer 21 between the source ohmic electrode 23a and the drain ohmic electrode 23b. The head portion of the gate electrode may be disposed on the insulating layer 24. The gate electrode may include a heat-resistant metal. The gate electrode may include nickel/gold (Ni/Au), platinum/nickel/tungsten nitride/gold ($Pt/Ni/WN_x/Au$), or titanium/platinum/gold (Ti/Pt/Au). The foot portion of the gate electrode may further penetrate the second layer of the active layer 21 consisting of the first layer including gallium nitride and the second layer including aluminum gallium nitride. In other words, the foot portion of the gate electrode may be connected to the first layer of the active layer 21.

The gate electrode includes both end parts (i.e., a first end part and a second end part) in an extending direction (i.e., a vertical direction of FIG. 1) of the gate electrode. The foot portion of each of the both end parts of the gate electrode may have a width less than a width of the head portion of another part of the gate electrode and greater than a width of the foot portion of another part of the gate electrode. The foot portion of each of the both end parts of the gate electrode may further penetrate the active layer 21 so as to be connected to the substrate 20.

As illustrated in FIGS. 1, 9A, and 9B, the gate electrode may include a T-type gate electrode part 28 including a foot portion and a head portion, a first field electrode part 29a, and a second field electrode part 29b. The head portion of the T-type gate electrode part 28 has a width greater than a width of the foot portion of the T-type gate electrode part 28. The first field electrode part 29a is disposed at a side of the head portion of the T-type gate electrode part 28. The second field electrode part 29b is disposed at a side of the foot portion of the T-type gate electrode 28 and under the first field electrode part 29a. In other words, each of the both end parts of the gate electrode may consist of the T-type gate electrode part 28, the first field electrode part 29a, and the second field electrode part 29b. Another part of the gate electrode may consist of the T-type gate electrode part 28 and the first field electrode part 29a.

The first field electrode part 29a may be disposed between the T-type gate electrode part 28 and the drain ohmic electrode 23b between which a great electric field is generated in operation of the field effect transistor. Thus, the first field electrode part 29a may be disposed at the side facing the drain ohmic electrode 23b of the T-type gate electrode part 28.

The second field electrode part 29b may be disposed in a boundary region between the T-type gate electrode part 28 and an active region 20a, where a great electric field is generated in the operation of the field effect transistor. Thus, the second field electrode part 29b may be disposed at the side of the foot portion of the T-type gate electrode part 28 of the end part of the gate electrode and under the first field electrode part 29a of the end part of the gate electrode.

Thus, the electric fields may be reduced between the gate electrode and the drain ohmic electrode 23b and between the gate electrode and the active region 20a, such that the field effect transistor may maintain its high frequency performance and may have a high breakdown voltage due to reduction of a leakage current.

A method of fabricating a field effect transistor according to some embodiment will be described with reference to FIGS. 1, 2A to 9A, and 2B to 9B hereinafter.

Figure 2A:
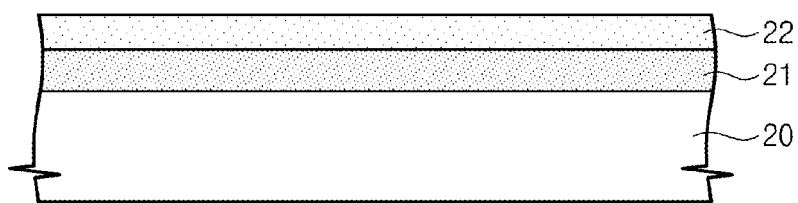
Figure 2B:
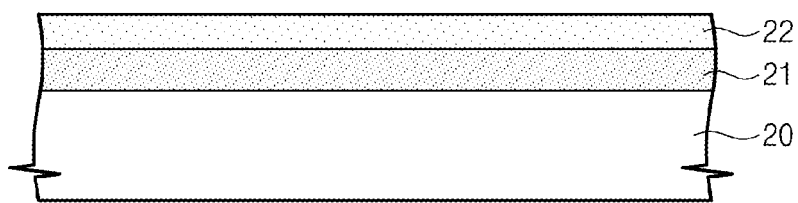

Referring to FIGS. 2A and 2B, an active layer 21 and a capping layer 22 may are sequentially formed on a substrate 20. The capping layer 22 and the active layer 21 may be patterned to define an active region 20a of FIG. 1.

The substrate 20 may be an insulating substrate. The insulating substrate may include gallium nitride, silicon, silicon carbide, semi-insulating gallium arsenide, or sapphire. The insulating substrate may be doped with dopant ions. The active layer 21 may be a double layer consisting of a first layer including gallium nitride and a second layer including aluminum gallium nitride (AlGaN). The capping layer 22 may include gallium nitride.

Figure 3A:
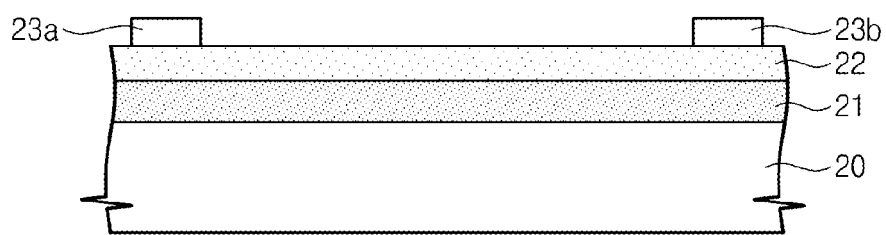
Figure 3B:
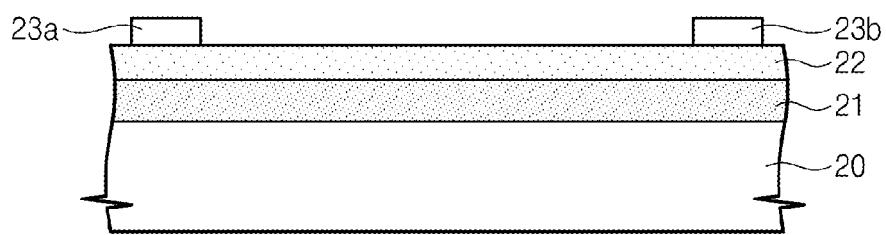

Referring to FIGS. 3A and 3B, a source ohmic electrode 23a and a drain ohmic electrode 23b are formed to be spaced apart from each other on the capping layer 22. The source and drain ohmic electrodes 23a and 23b may cross over the active region 20a in parallel to each other, as illustrated in FIG. 1. The source and drain ohmic electrodes 23a and 23b may include a conductive material. For example, the source and drain ohmic electrodes 23a and 23b may include an alloy formed by performing a rapid thermal treatment on a stack structure including titanium/aluminum/nickel/gold (Ti/Al/Ni/Au), a stack structure including titanium/aluminum/nickel/palladium/gold (Ti/Al/Ni/Pd/Au), or a stack structure of gold-germanium/nickel/gold (AuGe/Ni/Au).

Figure 4A:
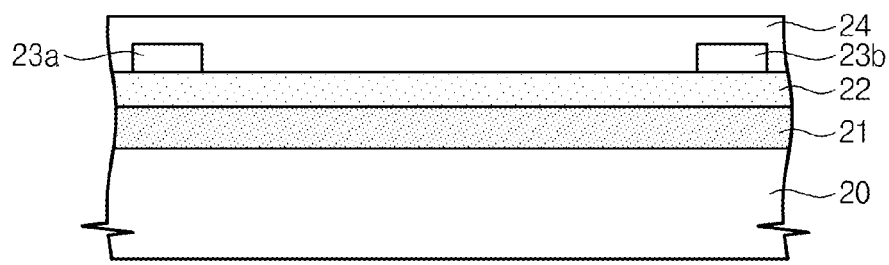
Figure 4B:
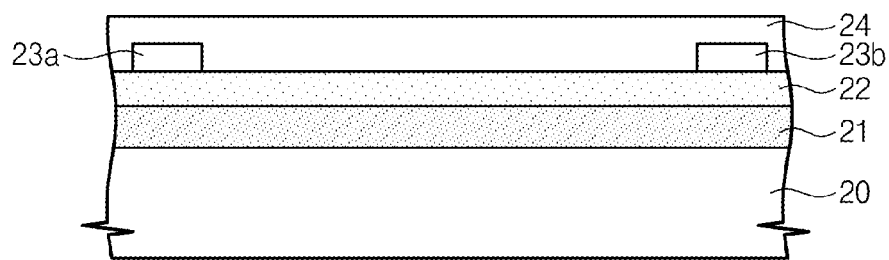

Referring to FIGS. 4A and 4B, an insulating layer 24 is formed on the capping layer 23 to cover the source and drain ohmic electrodes 23a and 23b. The insulating layer 24 may include silicon nitride (SiN), silicon oxide (SiO$_2$), porous silicon oxide, or benzocyclobutene (BCB).

Figure 5A:
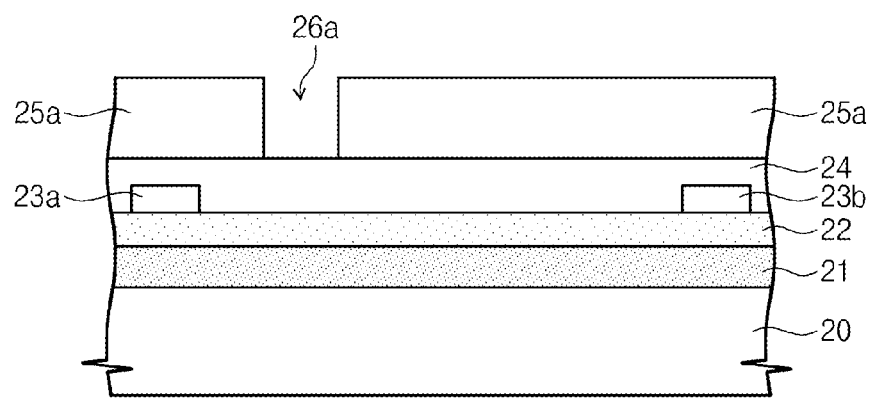
Figure 5B:
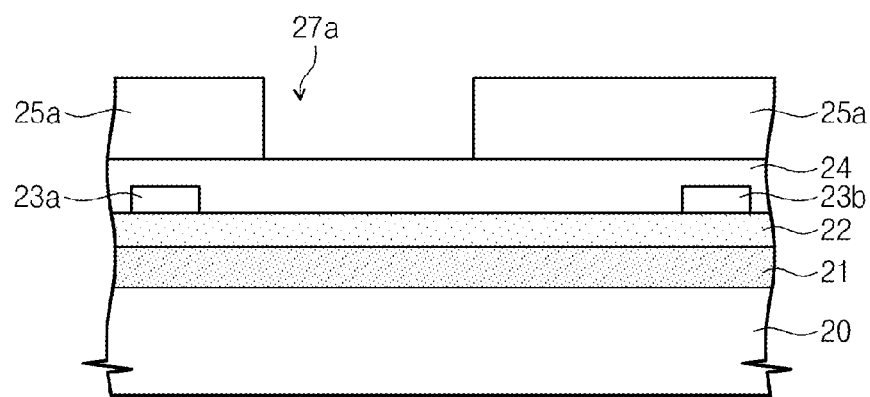

Referring to FIGS. 5A and 5B, a first photoresist layer 25a is formed to have a first opening (26a and 27a) exposing a portion of the insulating layer 24 between the source and drain ohmic electrodes 23a and 23b. The first photoresist layer 25a may include polymethyl methacrylate (PMMA). The first opening (26a and 27a) may cross over the active region 20a.

The first opening may include edge regions 27a and the inter-region 26a disposed between the edge regions 27a in a longitudinal direction of the first opening. The edge regions 27a may correspond to the both end parts of the gate electrode described with reference to FIG. 1, respectively. The inter-region 26a may correspond to another part of the gate electrode described with reference to FIG. 1. The edge regions 27a may overlap with boundaries of the active region 20a under the first opening, respectively. Each of the edge regions 27a may have a width greater than a width of the inter-region 26a.

Figure 6A:
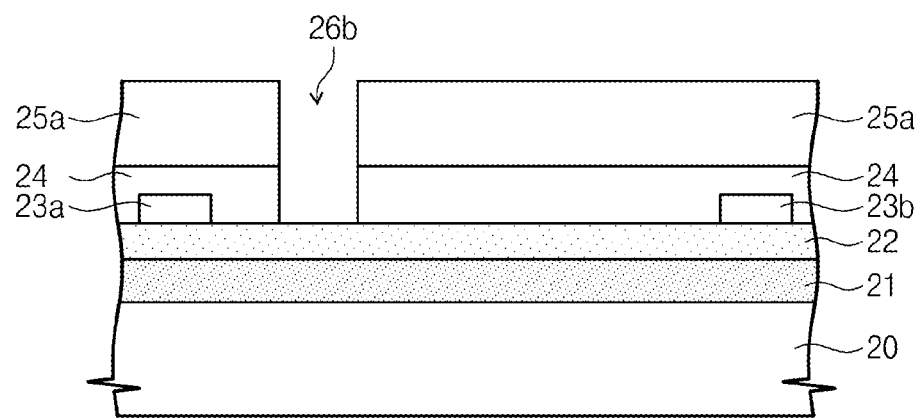
Figure 6B:
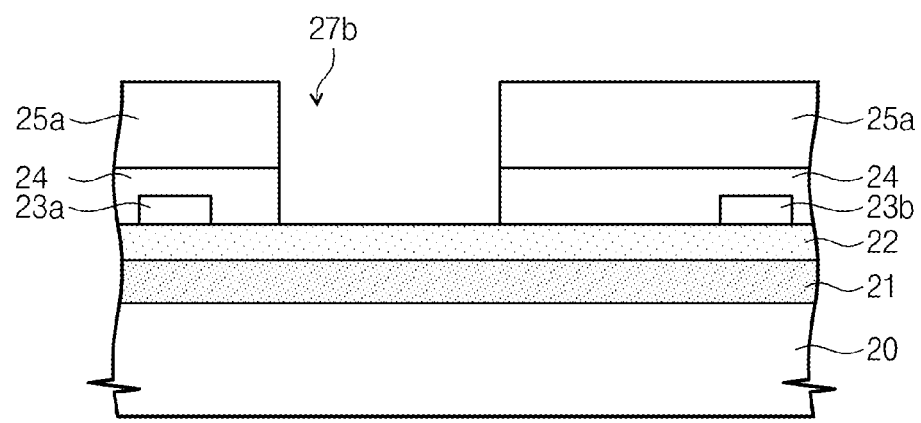
Figure 7A:
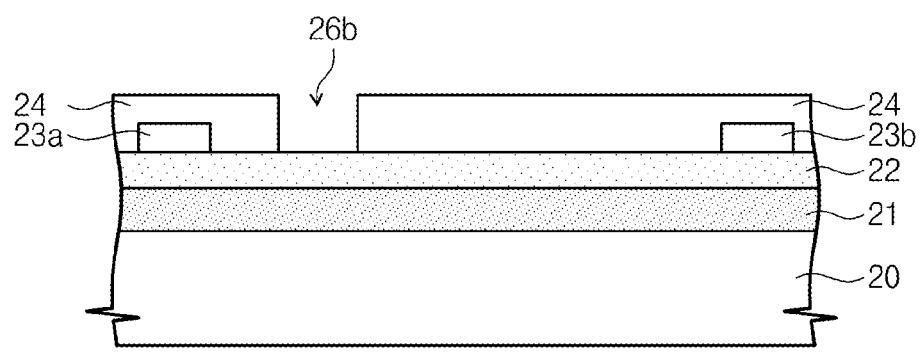
Figure 7B:
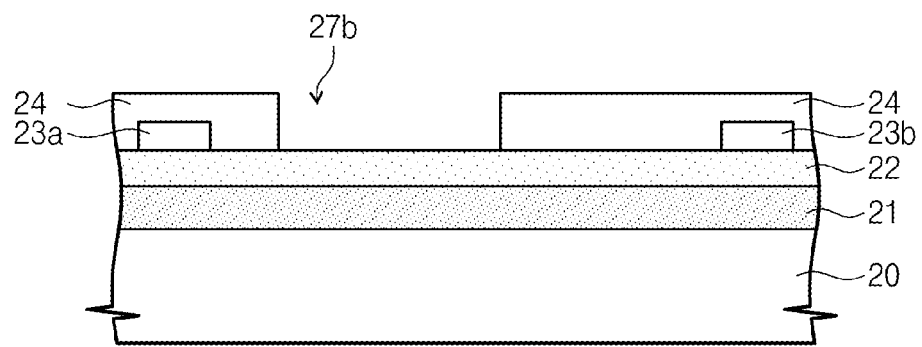
Figure 8A:
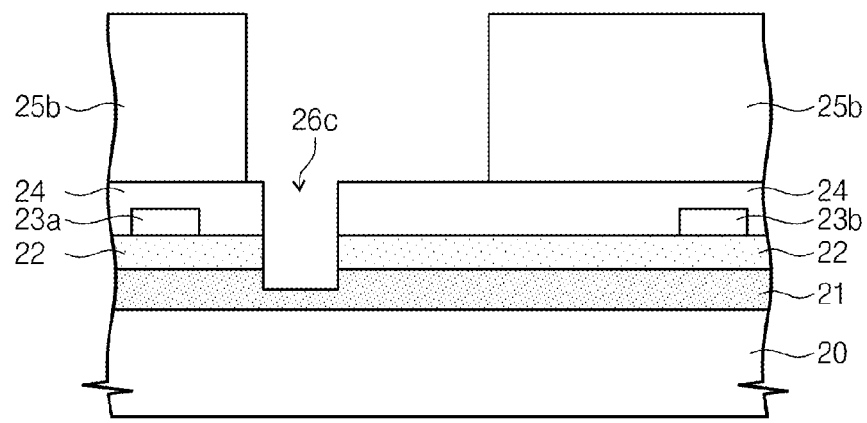
Figure 8B:
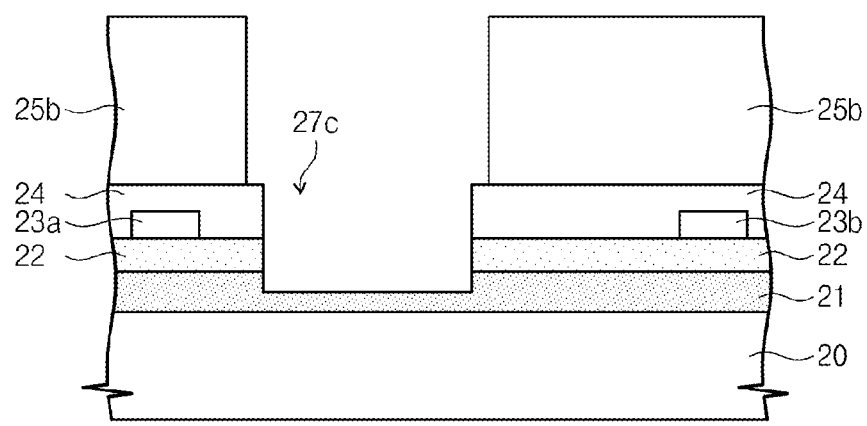

Referring to FIGS. 6A and 6B, the insulating layer 24 under the first opening (26a and 27a) is removed by an etching process using the first photoresist layer 25a as an etch mask. Thus, the capping layer 22 under the first opening 26a and 27a is exposed and a second opening (26b and 27b) is defined in the insulating layer 24. The second opening (26b and 27b) may include edge regions 27b and the inter-region 26b disposed between the edge regions 27b. The inter-region 26b and the edge regions 27b of the second opening are formed under the inter-region 26a and the edge regions 27a of the first opening, respectively.

The insulating layer 24 under the first opening (26a and 27a) may be removed using a reactive ion etching (RIE) method, a magnetically enhanced reactive ion etching (ME-RIE) method, or an inductive coupled plasma (ICP) method.

Referring to FIGS. 7A, 7B, 8A, and 8B, after the first photoresist layer 25a is removed, the capping layer 22 under the second opening is removed by an etching process using the insulating layer 24 as an etch mask, so that the active layer 21 under the second opening is exposed and a third opening (26c and 27c) is defined in the capping layer 22.

The third opening may include edge regions 27c and the inter-region 26c disposed between the edge regions 27c. The inter-region 26c and the edge regions 27c of the third opening are formed under the inter-region 26b and the edge regions 27b of the second opening, respectively. The second layer (e.g., AlGaN) of the active layer 21 under the third opening (26c and 27c) may be further removed. In an embodiment, the edge regions 27c of the third opening may completely penetrate the active layer 21 thereunder, such that the edge regions 27c may expose the substrate 20. Since the edge region 27a of the first opening has the width greater than the width of the inter-region 26a of the first opening, the edge region 27c of the third opening may have a width greater than a width of the inter-region 26c of the third opening. Thus, an etch loading effect may be caused by a difference between the widths of the edge and center regions 27c and 26c of the third opening, such that the edge region 27c of the third opening may completely penetrate the active layer 21 but the inter-region 26c of the third opening may penetrate the second layer of the active layer 21.

The capping layer 22 under the third opening (26c and 27c) may be removed by performing one or more etching processes. The etching process of the capping layer 22 may include a wet etching process and/or a dry etching process which may be performed with measurement of a current. The dry etching process may use an electron cyclotron resonance (ECR) method or an ICP method. These methods may use a carbon tetra-fluoride ($CF_4$) gas, a boron tri-chloride ($BCl_3$) gas, a chlorine ($Cl_2$) gas, or a sulfur hexafluoride ($SF_6$). The wet etching process may use at least one of various etching solutions such as a phosphoric acid-based solution including phosphoric acid ($H_3PO_4$), hydrogen peroxide ($H_2O_2$), and/or water ($H_2O$) which may be suitably mixed with each other.

A second photoresist layer 25b having a fourth opening is formed on the insulating layer 24 having the third opening (26c and 27c). The fourth opening has a width greater than the widths of the third opening (26c and 27c). That is, the width of the fourth opening is greater than the width of the edge region 27c of the third opening. The second photoresist layer 25b may include polymethyl methacrylate (PMMA).

Referring to FIGS. 9A and 9B, a gate electrode may be formed to fill the third opening (26c and 27c) and the fourth opening. The gate electrode is in contact with the active layer 21 through the third opening (26c and 27c). After the formation of the gate electrode, the second photoresist layer 25b is removed.

Even through not shown in the drawings, a conductive layer for the gate electrode may also be formed on a top surface of the second photoresist layer 25b. The conductive layer on the top surface of the second photoresist layer 25b may be removed by a lift-off process for removing the second photoresist layer 25b.

The gate electrode may be formed to consist of a foot portion successively penetrating the insulating layer 24 and the capping layer 22 and a head portion extending from the foot portion onto the insulating layer 24. The foot portion of the gate electrode is connected to the active layer 21 between the source ohmic electrode 23a and the drain ohmic electrode 23b. The gate electrode may include a heat-resistant metal. The gate electrode may include nickel/gold (Ni/Au), platinum/nickel/tungsten nitride/gold (Pt/Ni/WN$_x$/Au), or titanium/platinum/gold (Ti/Pt/Au). In an embodiment, the foot portion of the gate electrode may further penetrate the second layer (e.g., AlGaN) of the active layer 21. In other words, the foot portion of the gate electrode may be connected to the first layer of the active layer 21.

The gate electrode includes both end parts in an extending direction (i.e., a vertical direction of FIG. 1) of the gate electrode. The foot portion of the end part of the gate electrode may have a width less than a width of the head portion of another part of the gate electrode and greater than a width of the foot portion of another part of the gate electrode. The foot portion of the end part of the gate electrode may further penetrate the active layer 21 so as to be connected to the substrate 20.

As illustrated in FIGS. 1, 9A, and 9B, the gate electrode may include a T-type gate electrode part 28 including a foot portion and a head portion, a first field electrode part 29a, and a second field electrode part 29b. The head portion of the T-type gate electrode part 28 has a width greater than a width of the foot portion of the T-type gate electrode part 28. The first field electrode part 29a is disposed at a side of the head portion of the T-type gate electrode part 28. The second field electrode part 29b is disposed at a side of the foot portion of the T-type gate electrode and under the first field electrode part 29a. In other words, each of the both end parts of the gate electrode may consist of the T-type gate electrode part 28, the first field electrode part 29a, and the second field electrode part 29b. Another part of the gate electrode may consist of the T-type gate electrode part 28 and the first field electrode part 29a.

The first field electrode part 29a may be disposed between the T-type gate electrode part 28 and the drain ohmic electrode 23b between which a great electric field is generated in operation of the field effect transistor. Thus, the first field electrode part 29a may be disposed at the side facing the drain ohmic electrode 23b of the T-type gate electrode part 28.

The second field electrode part 29b may be disposed in a boundary region between the T-type gate electrode part 28 and the active region 20a, where a great electric field is generated in the operation of the field effect transistor. Thus, the second field electrode part 29b may be disposed at the side of the foot portion of the T-type gate electrode part 28 of the end part of the gate electrode and under the first field electrode part 29a of the end part of the gate electrode.

Thus, the electric fields may be reduced between the gate electrode and the drain ohmic electrode 23b and between the gate electrode and the active region 20a, such that the field effect transistor may maintain its high frequency performance and may have a high breakdown voltage due to reduction of a leakage current.

Figure 10:
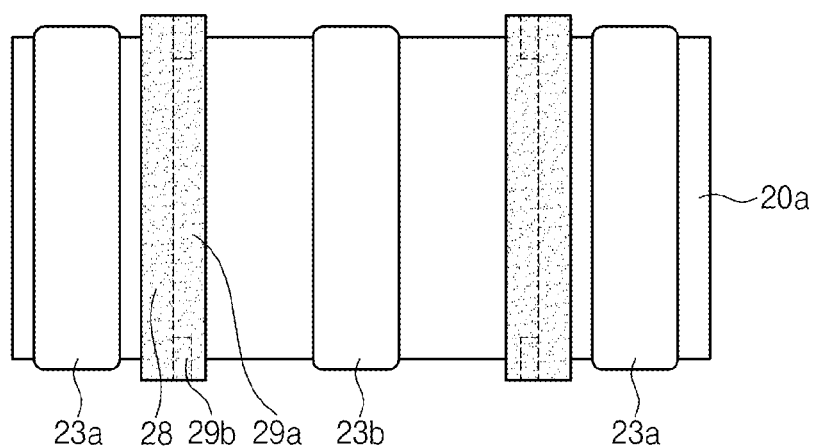
FIGS. 10 to 12 are plan views illustrating field effect transistors according to other embodiments of the inventive concept.
Figure 11:
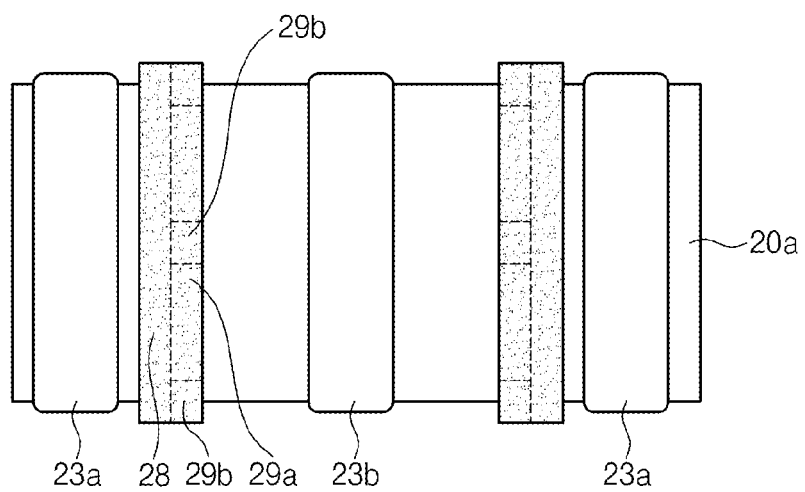
Figure 12:
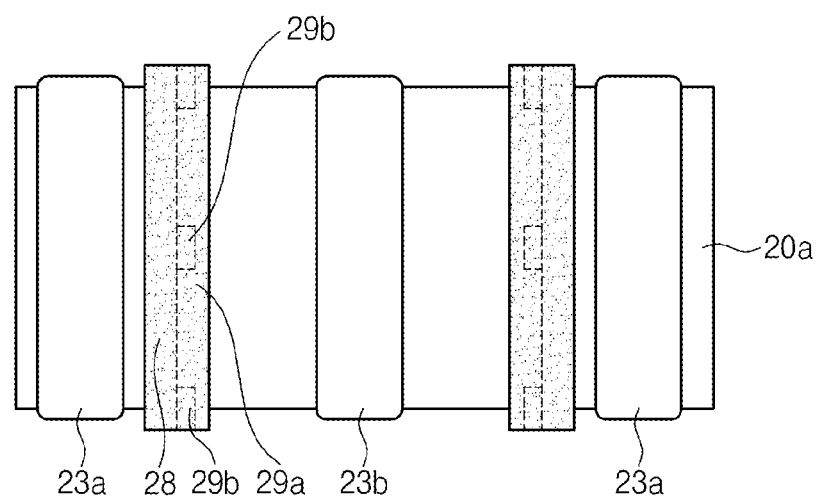

Field effect transistors according to other embodiments will be described with reference to FIGS. 10 to 12 hereinafter. FIGS. 10 to 12 are plan views illustrating field effect transistors according to other embodiments of the inventive concept. The same elements as described in the aforementioned embodiments will be indicated by the same reference numerals or the same reference designators. For the purpose of ease and convenience in explanation, the descriptions to the same elements as described in the aforementioned embodiments will be omitted or mentioned briefly.

A field effect transistor illustrated in FIG. 10 includes a gate electrode having a structure different from that of the gate electrode in the aforementioned embodiments of FIGS. 1, 9A, and 9B.

A second field electrode part 29b of the gate electrode in FIG. 10 may be disposed at a side of the foot portion of the T-type gate electrode part 28 in each of both end parts of the gate electrode in an extending direction of the gate electrode. At this time, the second field electrode part 29b of the gate electrode in FIG. 10 may have a width less than the width of the second field electrode part 29b of the gate electrode in FIGS. 1, 9A, and 9B. This is because an electric field between the gate electrode and the active region 20a is less than an electric field between the gate electrode and the drain ohmic electrode 23b in operation of the field effect transistor.

A field effect transistor illustrated in FIG. 11 includes a gate electrode having a structure different from those of the gate electrodes in the aforementioned embodiments.

A second field electrode part 29b of the gate electrode in FIG. 11 may be additionally disposed at a side of a foot portion of the T-type gate electrode part 28 in a center part of the gate electrode in an extending direction of the gate electrode. Thus, an electric field generated between the gate electrode and the drain ohmic electrode 23b may be further reduced in operation of the field effect transistor.

A field effect transistor illustrated in FIG. 12 includes a gate electrode having a structure different from those of the gate electrodes in the aforementioned embodiments.

Referring to FIG. 12, second field electrode parts 29b may be disposed at a side of the foot portion of the T-type gate electrode part 28. The second field electrode parts 29b may be included in the both end parts and the center part of the gate electrode, respectively. Each of the field electrode parts 29b of the gate electrode in FIG. 12 may have a width less than the width of the second field electrode part 29b of the gate electrode in FIG. 11. An electric field generated between the gate electrode and the active region 20a is less than an electric field generated between the gate electrode and the drain ohmic electrode 23b in operation of the field effect transistor, such that the filed electrode part 29b in FIG. 12 may have a small width. Additionally, the second field electrode part 29b is also be disposed in the center part of the gate electrode, such that the electric field between the gate electrode and the drain ohmic electrode 23b may be further reduced in the operation of the field effect transistor.

Figure 13:
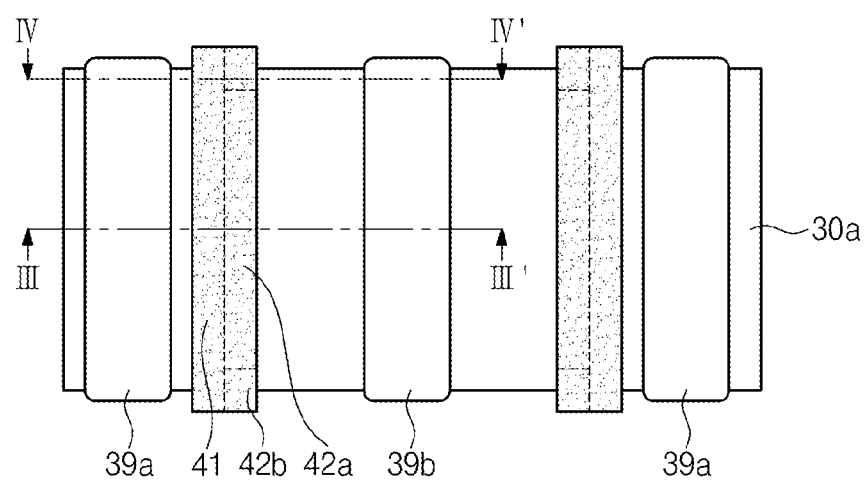
FIG. 13 is a plan view illustrating a field effect transistor according to still other embodiments of the inventive concept.

A field effect transistor and a method of fabricating the same according to still other embodiments will be described with reference to FIGS. 13, 14A to 22a, and 14B to 22B hereinafter. FIG. 13 is a plan view illustrating a field effect transistor according to still other embodiments of the inventive concept. FIGS. 14A to 22A are cross-sectional views taken along a line III-III' of FIG. 13 to illustrate a method of fabricating a field effect transistor according to still other embodiments of the inventive concept. FIGS. 14B to 22B are cross-sectional views taken along a line IV-IV' of FIG. 13 to illustrate a method of fabricating a field effect transistor according to still other embodiments of the inventive concept.

Figure 22A:
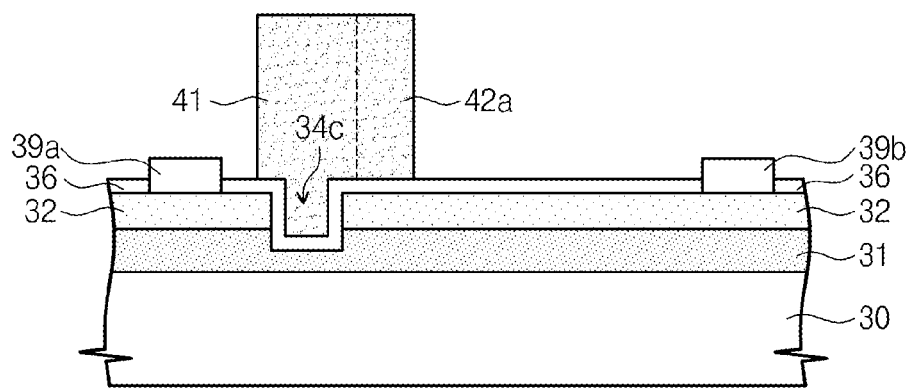
Figure 22B:
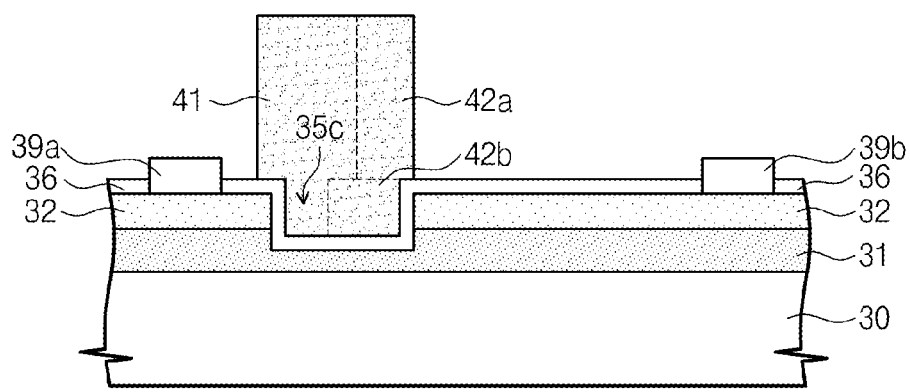

A field effect transistor illustrated in FIGS. 13, 22A, and 22B includes an insulating layer having a different structure from that of the field effect transistors of the embodiments described above.

An insulating layer 36 of the field effect transistor of FIGS. 13, 22A, and 22B may be disposed between the gate electrode and an active layer 31 and between the gate electrode and a capping layer 32. This is because a portion of the active layer 21 on which the gate electrode will be formed is exposed before source and drain ohmic patterns 39a and 39b are formed on the capping layer 32.

A method of fabricating a field effect transistor according to the present embodiment will be described with reference to FIGS. 13, 14A to 22A, and 14B to 22B.

Figure 14A:
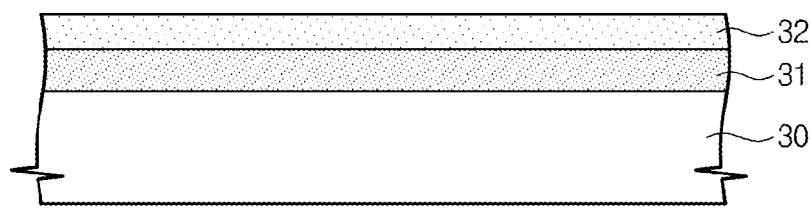
Figure 14B:
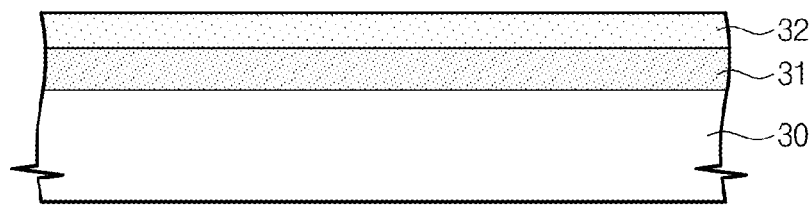

Referring to FIGS. 14A and 14B, an active layer 31 and the capping layer 32 may be sequentially formed on a substrate 30. The capping layer 32 and the active layer 31 may be patterned to define an active region 30a illustrated in FIG. 13.

Figure 15A:
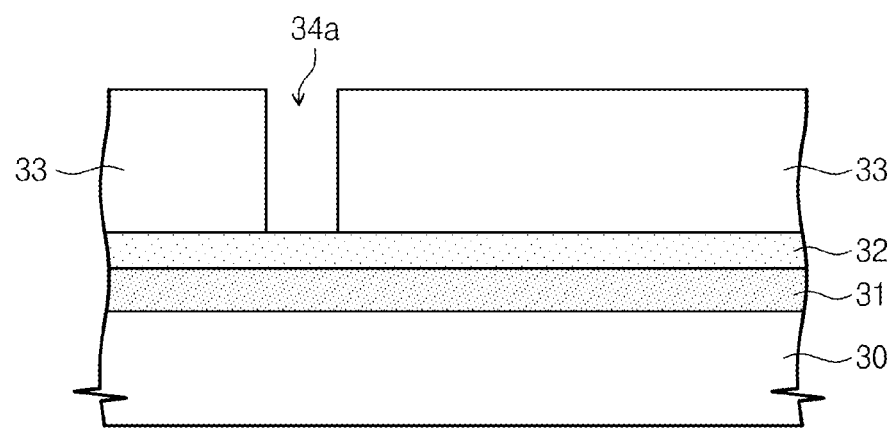
Figure 15A:
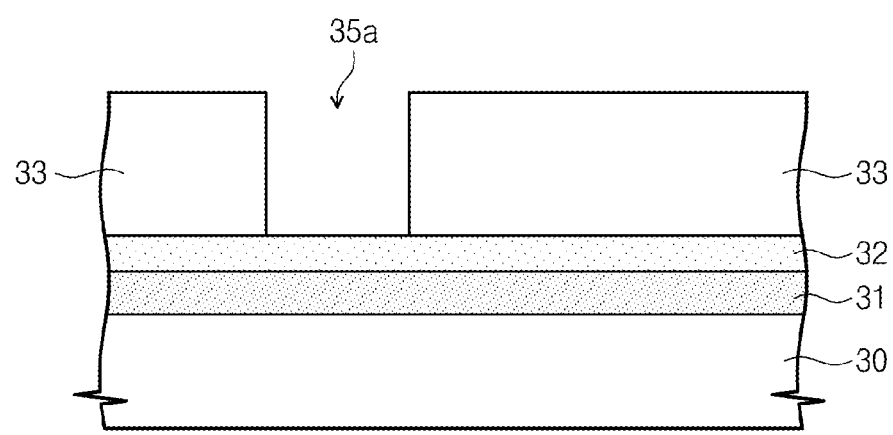

Referring to FIGS. 15A and 15B, a first photoresist layer 33 is formed to have a first opening (34a and 35a) exposing a portion of the capping layer 32. The first opening (34a and 35a) may cross over the active region 30a. The first opening may include edge regions 34a and the inter-region 35a disposed between the edge regions 34a in a longitudinal direction of the first opening. The edge regions 34a of the first opening may correspond to both end parts of the gate electrode in an extending direction of the gate electrode in FIG. 13, respectively. The inter-region 34a of the first opening may correspond to another part of the gate electrode in FIG. 13. The edge regions 35a may overlap with boundaries of the active region 30a under the first opening, respectively. Each of the edge regions 35a may have a width greater than a width of the inter-region 34a.

Figure 16A:
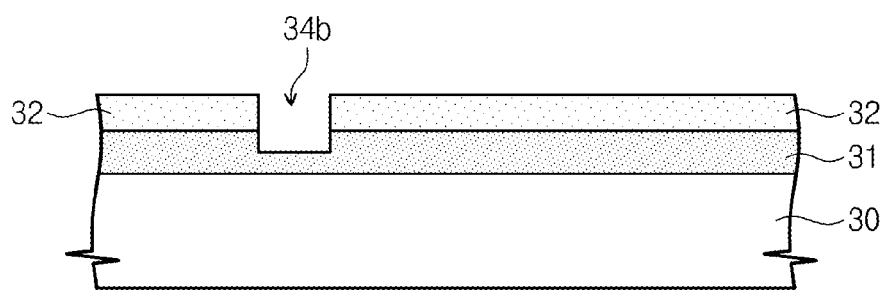
Figure 16B:
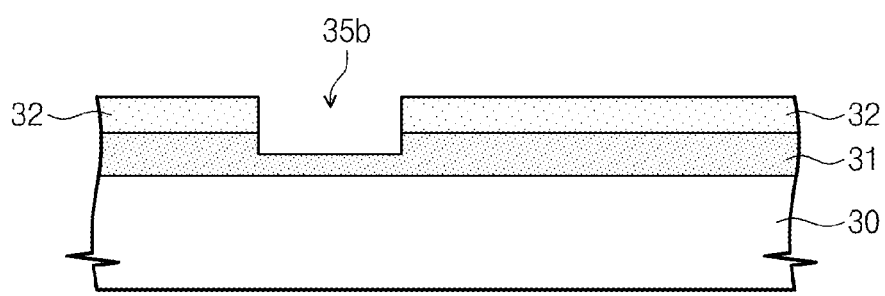

Referring to FIGS. 16A and 16B, the capping layer 32 under the first opening (34a and 35a) may be removed by an etching process using the first photoresist layer 33 as an etch mask in order to expose the active layer 31 under the first opening (34a and 35a). Thus, a second opening (34b and 35b) may be formed in the capping layer 31. The second opening may include edge regions 35b and the inter-region 34b disposed between the edge regions 35b. The edge regions 35b and the inter-region 34b of the second opening may be formed under the edge regions 35a and the inter-region 34a of the first opening, respectively. Thereafter, the first photoresist layer 33 is removed.

The active layer 31 may consist of a first layer including gallium nitride and a second layer including aluminum gallium nitride (AlGaN). The second layer of the active layer 31 under the second opening (34b and 35b) may be removed. In an embodiment, the active layer 31 under each of the edge regions 35b of the second opening may be completely removed, such that each of the edge regions 35b of the second opening may expose the substrate 30. In this case, the inter-region 34b of the second opening may expose the first layer of the active layer 31.

Figure 17A:
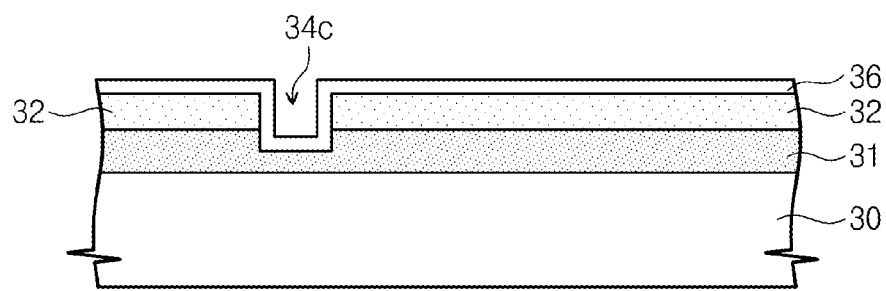
Figure 17B:
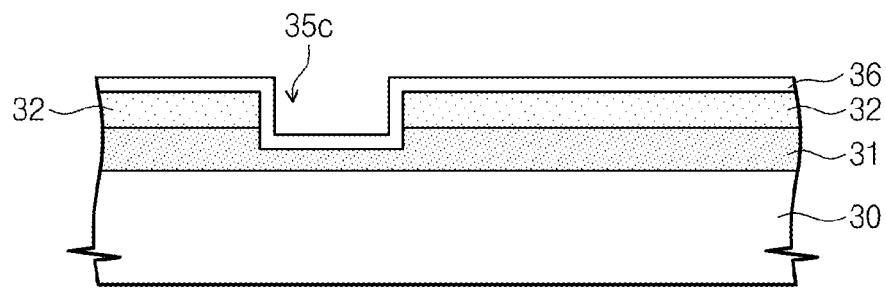

Referring to FIGS. 17A and 17B, an insulating layer 36 may be formed on an entire surface of the substrate 30. A third opening (34c and 35c) may be defined in the second opening (34b and 35b) by the insulating layer 36 disposed in the second opening (34b and 35b). The third opening may include edge regions 35c and the inter-region 34c disposed between the edge regions 35c. The edge regions 35c and the inter-region 34c of the third opening may be disposed in the edge regions 35b and the inter-region 34b of the second opening, respectively.

Figure 18A:
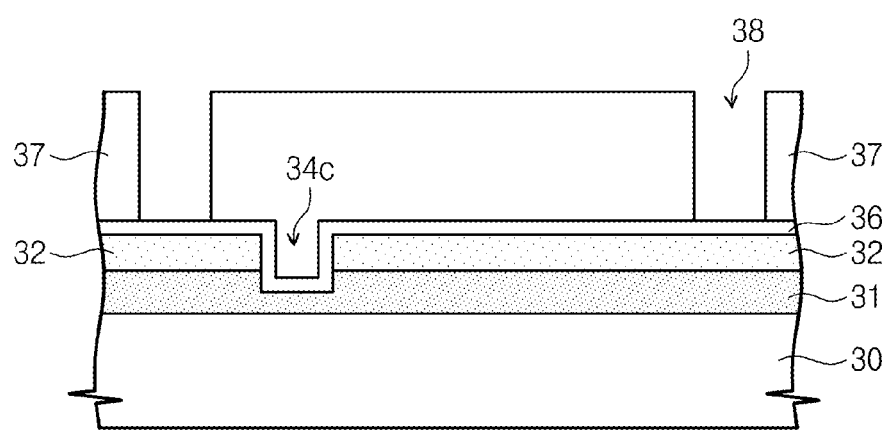
Figure 18B:
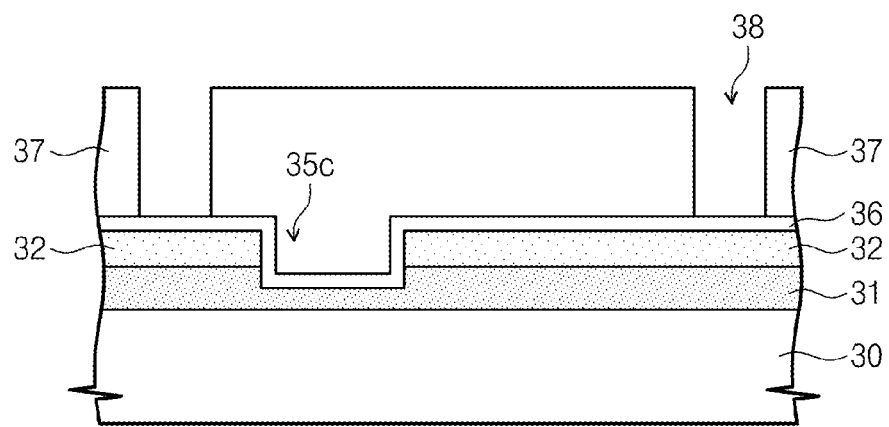

Referring to FIGS. 18A and 18B, a second photoresist layer 37 is formed to have fourth openings 38. The fourth openings 38 may expose portions of the insulating layer 36 disposed at both sides of the third opening (34c and 35c), respectively. The fourth openings 38 are spaced apart from the third opening (34c and 35c).

Figure 19A:
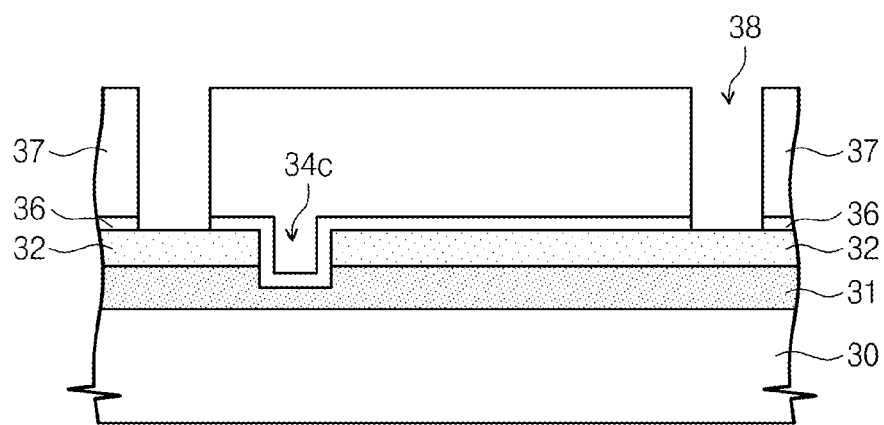
Figure 19B:
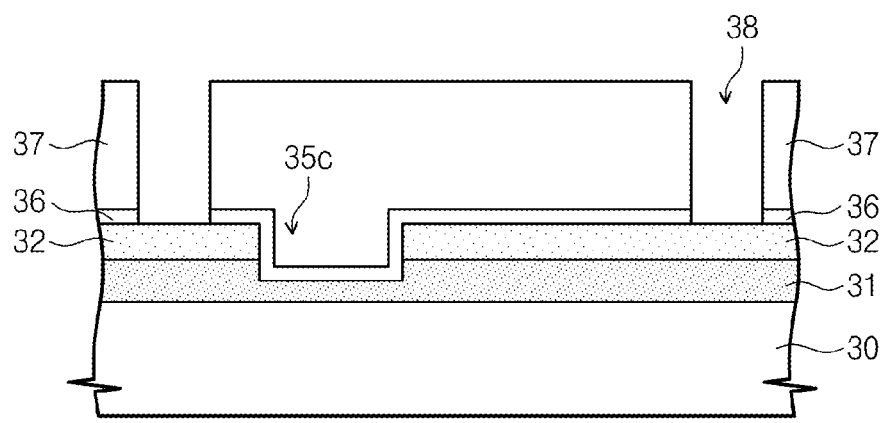

Referring to FIGS. 19A and 19B, portions of the insulating layer 36 under the fourth openings 38 may be removed by an etching process using the second photoresist layer 37 as an etch mask in order to expose the capping layer 32 under the fourth openings 38.

Figure 20A:
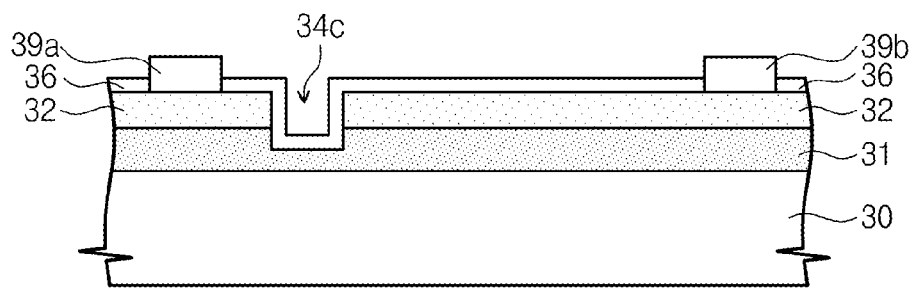
Figure 20B:
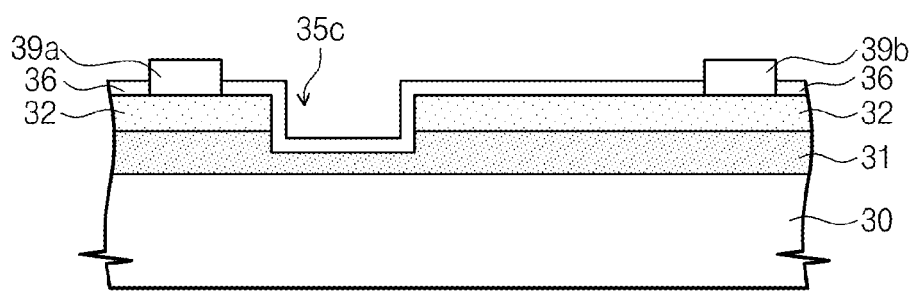

Referring to FIGS. 20A and 20B, source and drain ohmic electrodes 39a and 39b may be formed on the exposed portions of the capping layers 32 in the fourth openings 38, respectively. Subsequently, the second photoresist layer 37 is removed.

Figure 21A:
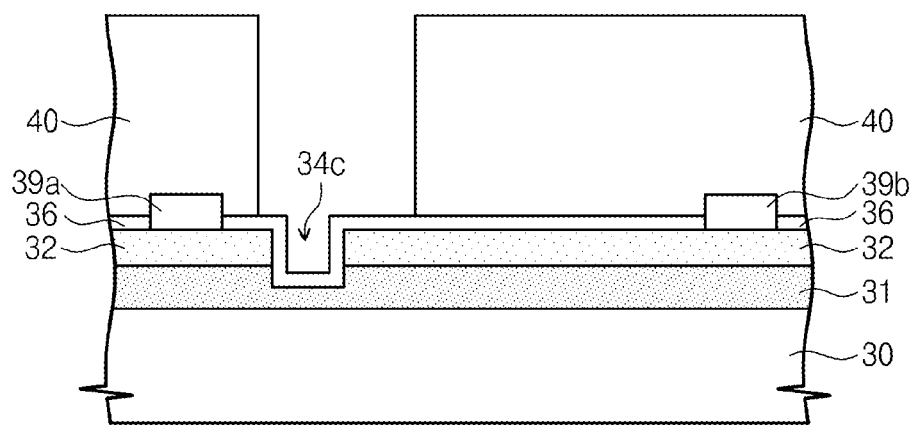
Figure 21B:
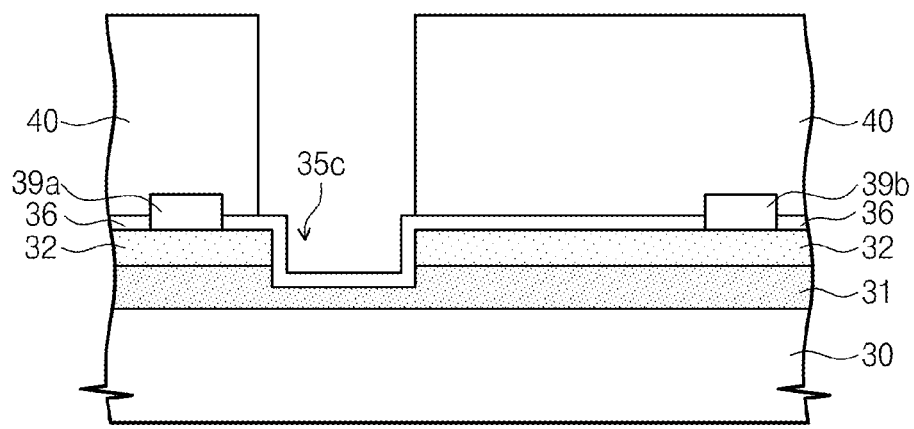

Referring to FIGS. 21A and 21B, a third photoresist layer 40 having a fifth opening is formed on the insulating layer 36 having the third opening (34c and 35c). The fifth opening of the third photoresist layer 40 may have a width greater than the widths of the third opening (34c and 35c). The fifth opening of the third photoresist layer 40 may expose the third opening (34c and 35c).

Referring to FIGS. 22A and 22B, a gate electrode may be formed to fill the third opening (34c and 35c) and the fifth opening. The insulating layer 36 may be disposed between the active layer 31 and a portion of the gate electrode in the third opening. Thereafter, the third photoresist layer 40 is removed.

In other words, the gate electrode may include a foot portion penetrating the capping layer 32 between the source and drain ohmic electrodes 39a and 39b and a head portion extending from the foot portion onto the capping layer 32. The insulating layer 36 may be disposed between the active layer 31 and the foot portion of the gate electrode, between the capping layer 32 and the foot portion of the gate electrode, and between the capping layer 32 and the head portion of the gate electrode. The foot portion of gate electrode may further penetrate of the second layer (e.g., AlGaN) of the active layer 31. Thus, the insulating layer 36 may be disposed between the foot portion of the gate electrode and the first layer of the active layer 31.

The gate electrode includes both end parts in an extending direction (i.e., a vertical direction of FIG. 13) of the gate electrode. The foot portion of the both end part of the gate electrode may have a width less than a width of the head portion of another part of the gate electrode and greater than a width of the foot portion of another part of the gate electrode. The foot portion of the both end part of the gate electrode may further penetrate the active layer 31.

As illustrated in FIGS. 13, 22A, and 22B, the gate electrode may include a T-type gate electrode part 41 including a foot portion and a head portion, a first field electrode part 42a, and a second field electrode part 42b. The head portion of the T-type gate electrode part 41 has a width greater than a width of the foot portion of the T-type gate electrode part 41. The first field electrode part 42a is disposed at a side of the head portion of the T-type gate electrode part 41. The second field electrode part 42b is disposed at a side of the foot portion of the T-type gate electrode 41 and under the first field electrode part 42a. In other words, each of the both end parts of the gate electrode may consist of the T-type gate electrode part 41, the first field electrode part 42a, and the second field electrode part 42b. Another part of the gate electrode may consist of the T-type gate electrode part 41 and the first field electrode part 42a.

The first field electrode part 42a may be disposed between the T-type gate electrode part 41 and the drain ohmic electrode 39b between which a great electric field is generated in operation of the field effect transistor. Thus, the first field electrode part 29a may be disposed at the side facing the drain ohmic electrode 39b of the T-type gate electrode part 41.

The second field electrode part 42b may be disposed in a boundary region between the T-type gate electrode part 41 and the active region 30a, where a great electric field is generated in the operation of the field effect transistor. Thus, the second field electrode part 42b may be disposed at the side of the foot portion of the T-type gate electrode part 41 of the end part of the gate electrode and under the first field electrode part 42a of the end part of the gate electrode.

Thus, the electric fields may be reduced between the gate electrode and the drain ohmic electrode 39b and between the gate electrode and the active region 30a, such that the field effect transistor may maintain its high frequency performance and may have a high breakdown voltage due to reduction of a leakage current.

Figure 23:
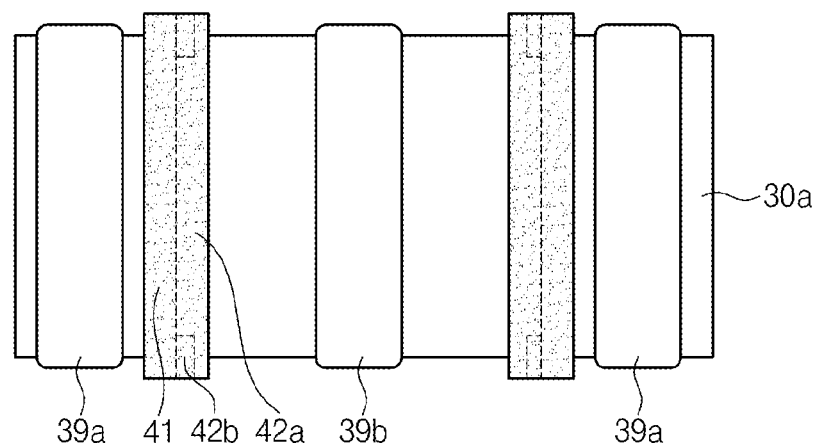
FIGS. 23 to 25 are plan views illustrating field effect transistors according to yet other embodiments of the inventive concept.
Figure 24:
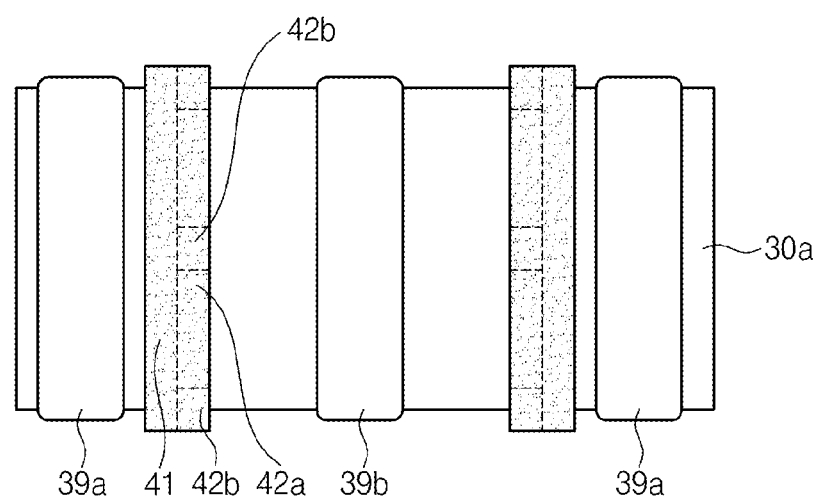
Figure 25:
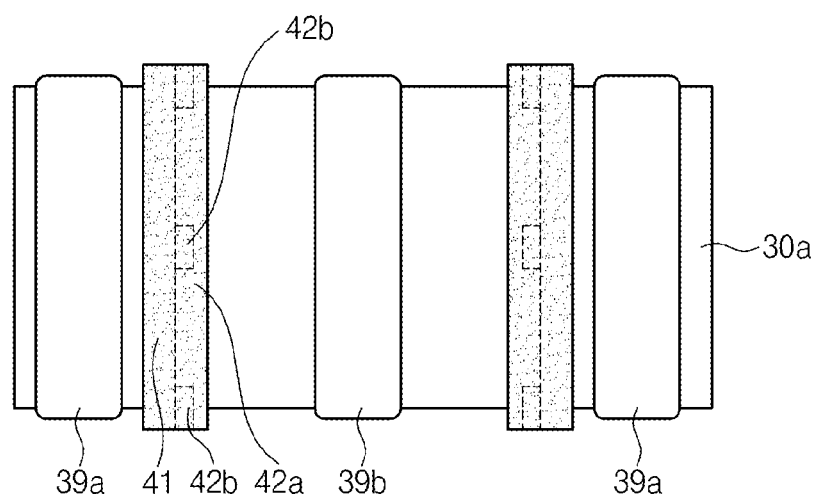

Field effect transistors according to yet other embodiments will be described with reference to FIGS. 23 to 25 hereinafter. FIGS. 23 to 25 are plan views illustrating field effect transistors according to yet other embodiments of the inventive concept. In yet other embodiments, the same elements as described in the embodiments of FIGS. 13, 22A, and 22B will be indicated by the same reference numerals or the same reference designators. For the purpose of ease and convenience in explanation, the descriptions to the same elements as described in the embodiments of FIGS. 13, 22A, and 22B will be omitted or mentioned briefly.

A field effect transistor illustrated in FIG. 23 includes a gate electrode having a structure different from that of the gate electrode in the aforementioned embodiments of FIGS. 13, 22A, and 22B.

A second field electrode part 42b of the gate electrode in FIG. 23 may be disposed at a side of the foot portion of the T-type gate electrode part 28 in each of both end parts of the gate electrode in an extending direction of the gate electrode. At this time, the second field electrode part 42b of the gate electrode in FIG. 23 may have a width less than the width of the second field electrode part 42b of the gate electrode in FIGS. 13, 22A, and 22B. This is because an electric field between the gate electrode and the active region 30a is less than an electric field between the gate electrode and the drain ohmic electrode 39b in operation of the field effect transistor.

A field effect transistor illustrated in FIG. 24 includes a gate electrode having a structure different from those of the gate electrodes in the aforementioned embodiments of FIGS. 13, 22A, 22B, and 23.

A second field electrode part 42b of the gate electrode in FIG. 24 may be additionally disposed at a side of a foot portion of the T-type gate electrode part 41 in a center part of the gate electrode in an extending direction of the gate electrode. Thus, an electric field generated between the gate electrode and the drain ohmic electrode 39b may be further reduced in operation of the field effect transistor.

A field effect transistor illustrated in FIG. 25 includes a gate electrode having a structure different from those of the gate electrodes in the aforementioned embodiments.

Referring to FIG. 25, second field electrode parts 42b may be disposed at a side of the foot portion of the T-type gate electrode part 41. The second field electrode parts 42b may be included in the both end parts and the center part of the gate electrode, respectively. Each of the field electrode parts 42b of the gate electrode in FIG. 25 may have a width less than the width of the second field electrode part 42b of the gate electrode in FIG. 24. An electric field generated between the gate electrode and the active region 30a is less than an electric field generated between the gate electrode and the drain ohmic electrode 39b in operation of the field effect transistor, such that the filed electrode part 42b in FIG. 25 may have a small width. Additionally, the second field electrode part 42b may be additionally disposed in the center part of the gate electrode, such that the electric field between the gate electrode and the drain ohmic electrode 39b may be further reduced in the operation of the field effect transistor.

The field effect transistor according to embodiments of the inventive concept includes the additional field electrode part disposed in the region in which a strong electric field is generated, such that the electric field may be reduced by the field electrode part. Thus, the field effect transistor may maintain its high frequency performance and may have the high breakdown voltage due to reduction of the leakage current.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a field effect transistor, the method comprising:

sequentially forming an active layer and capping layer on a substrate;

forming a first photoresist layer having a first opening exposing a portion of the capping layer;

removing the portion of the capping layer under the first opening by an etching process using the first photoresist layer as an etch mask to expose the active layer under the first opening and to define a second opening in the capping layer;

removing the first photoresist layer;

forming an insulating layer on an entire surface of the substrate to define a third opening surrounded the insulating layer in the second opening;

forming a second photoresist layer having fourth openings exposing portions of the insulating layer at both sides of the third opening, respectively, the exposed portions of the insulating layer spaced part from the third opening;

removing the exposed portions of the insulating layer under the fourth openings by an etching process using the second photoresist layer as an etch mask to expose the capping layer under the fourth openings;

forming a source ohmic electrode and a drain ohmic electrode on exposed portions of capping layer in the fourth openings, respectively;

removing the second photoresist layer;

forming a third photoresist layer having a fifth opening on the insulating layer having the third opening, the fifth opening having a width greater than a width of the third opening;

forming a gate electrode filling the third opening and the fifth opening; and removing the third photoresist layer, wherein the gate electrode includes a foot portion adjacent to the active layer and a head portion disposed on the foot portion and having a width greater than a width of the foot portion;

wherein the gate electrode includes both end parts in an extending direction of the gate electrode;

wherein the foot portion of each of the both end parts of the gate electrode has a width less than a width of the head portion of another part of the gate electrode and greater than a width of the foot portion of the another part of the gate electrode; and wherein the foot portion of each of the both end parts of the gate electrode further penetrates the active layer so as to be adjacent to the substrate.

2. The method of claim 1, wherein the foot portion of a center part of the gate electrode in the extending direction of the gate electrode has a width less than the width of the head portion of the another part of the gate electrode and greater than the width of the foot portion of the another part of the gate electrode; and wherein the foot portion of the center part of the gate electrode further penetrates the active layer so as to the adjacent to the substrate.

3. The method of claim 1, wherein the active layer includes a first layer including gallium nitride and a second layer including aluminum gallium nitride (AlGaN).

4. The method of claim 1, wherein the capping layer is formed of gallium nitride.

5. The method of claim 1, wherein the insulating layer includes silicon nitride, silicon oxide, porous silicon oxide, or benzocyclobutene.

* * * * *